(12) United States Patent
Suzuki et al.

(10) Patent No.: US 7,944,720 B2
(45) Date of Patent: May 17, 2011

(54) SEMICONDUCTOR INTEGRATED CIRCUIT, PWM SIGNAL OUTPUT DEVICE, AND POWER CONVERSION CONTROL APPARATUS

(75) Inventors: Takahiro Suzuki, Tokai (JP); Yasuo Notohara, Hitachiota (JP); Tsunehiro Endo, Hitachiota (JP); Yuji Mori, Zama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 449 days.

(21) Appl. No.: 12/192,007

(22) Filed: Aug. 14, 2008

(65) Prior Publication Data

US 2009/0066384 A1 Mar. 12, 2009

(30) Foreign Application Priority Data

Sep. 7, 2007 (JP) ................................. 2007-232721

(51) Int. Cl.
*H02M 1/10* (2006.01)
(52) U.S. Cl. .......................................... 363/65; 323/282
(58) Field of Classification Search .......... 323/282–288, 323/277, 290, 299; 363/41, 34, 39, 65, 89, 363/97, 98; 701/102–103, 115; 123/406.65, 123/486
See application file for complete search history.

(56) References Cited

U.S. PATENT DOCUMENTS

| 6,979,987 | B2 * | 12/2005 | Kernahan et al. | ............. 323/283 |
| 7,092,265 | B2 * | 8/2006 | Kernahan | ........................ 363/65 |
| 7,417,877 | B2 * | 8/2008 | Leung et al. | .................... 363/49 |
| 7,428,159 | B2 * | 9/2008 | Leung et al. | .................... 363/95 |
| 7,640,455 | B2 * | 12/2009 | Leung et al. | .................... 714/24 |

FOREIGN PATENT DOCUMENTS

| JP | 2000-312486 | 11/2000 |
| JP | 2001-352764 | 12/2001 |
| JP | 2006-158064 | 6/2006 |

* cited by examiner

*Primary Examiner* — Rajnikant B Patel
(74) *Attorney, Agent, or Firm* — Miles & Stockbridge P.C.

(57) ABSTRACT

Provided is a control technique of a PWM conversion type power converter capable of compensating for a voltage error due to voltage drop mainly at a switching element and managing a switching time of a PWM signal at the same time, and capable of suppressing increase/decrease of software operation load and addition of a hardware circuit to the minimum. A semiconductor integrated circuit having a PWM signal generating unit which generates a PWM signal is provided with a PWM timer unit including a counter counting a pulse width of a pulse signal inputted from the outside with delay from a PWM signal, a register loading a counter value of the counter in synchronization with the PWM signal, and an A/D converting unit converting an analog signal serving as a source signal of the pulse signal inputted from the outside to a digital signal.

14 Claims, 12 Drawing Sheets

(a) ACTIVATION (b) CURRENT POLARITY CHANGE

US 7,944,720 B2

SEMICONDUCTOR INTEGRATED CIRCUIT, PWM SIGNAL OUTPUT DEVICE, AND POWER CONVERSION CONTROL APPARATUS

CROSS-REFERENCE TO RELATED APPLICATION

The present application claims priority from Japanese Patent Application No. JP 2007-232721 filed on Sep. 7, 2007, the content of which is hereby incorporated by reference into this application.

TECHNICAL FIELD OF THE INVENTION

The present invention relates to a PWM signal generation technique of a power converter controlled by a pulse width modulation (PWM) signal. More particularly, the present invention relates to a technique effectively applied to a control apparatus of a PWM type power converter that compensates for an applied voltage error due to dead time and delay of a switching element, and the like.

BACKGROUND OF THE INVENTION

For example, in a PWM signal generation technique for a power converter, when a power converter is PWM-controlled, it is essential to add dead time to a PWM signal so as to prevent short-circuiting due to switching delay of a switching element connected in series between power sources. However, influence of dead time causes mismatch of an output voltage of the power converter with a voltage command value and distortion in a load current waveform.

Accordingly, as a method for compensating for the influence of dead time, many compensation methods such as a system where compensation of a preset compensation amount to a voltage command value is performed according to a load current polarity or a system where compensation is performed by feeding back an output voltage from the power converter have been proposed.

The system where compensation of a preset correction amount is performed generates an error due to a difference between a set correction amount and an operating speed of an actual switching element and the like, which results in impossibility of precise compensation. As the system for conducting compensation by performing feedback of an output voltage, a system realizing compensation by utilizing hardware (for example, Japanese Patent Application Laid-Open Publication No. 2000-312486 (Patent Document 1)) and a system realizing compensation by utilizing software (for example, Japanese Patent Application Laid-Open Publication No. 2001-352764 (Patent Document 2)) are known. Further, techniques disclosed in Japanese Patent Application Laid-Open Publication No. 2006-158064 (Patent Document 3) and the like have been proposed.

SUMMARY OF THE INVENTION

Examples of the system realizing compensation by utilizing hardware and the system realizing compensation by utilizing software will be explained with reference to FIGS. 11 to 13. The inventors of the present invention have examined or studied techniques shown in FIGS. 11 to 13 as premises of the present invention, where FIG. 11 is a configuration diagram of a whole motor driving apparatus realized by hardware, FIG. 12 is a time chart upon operation of the apparatus shown in FIG. 11, and FIG. 13 is a block diagram of a motor driving apparatus realized by software.

In FIG. 11, a motor driving apparatus comprises: a PWM signal generating section 7 which outputs a PWM signal using a microcomputer or the like; a drive circuit 2 which amplifies the PWM signal to drive switching elements 9; an inverter circuit 3 connected to a direct current power source; a motor 4; a voltage detecting circuit 5 which outputs levels of a phase voltage of the inverter circuit 3 as an output voltage pulse signal; dead time compensating circuit 6 which outputs a corrected PWM signal obtained by performing dead time correction from a PWM signal outputted from the PWM signal generating section 7 and an output voltage pulse signal of the voltage detecting circuit 5, etc.

FIG. 12 is a time chart (showing one phase (U-phase)) showing an operation performed at the dead time compensating circuit 6, where a PWM signal Ur prepared by comparing a triangle wave that is a carrier signal with a voltage command, a up-down counter value (hereinafter, called counter value) obtained by counting time difference between the PWM signal Ur and an output voltage pulse signal Uf outputted from the voltage detecting circuit 5, corrected PWM signals Up and Un (an upper arm signal Up and a lower arm signal Un of the inverter) obtained by conducting dead time compensation from the counter value, and the output voltage pulse signal Uf outputted from the voltage detecting circuit 5 are shown, and where a state where this circuit is activated at (a) and polarity of current flowing in the motor 4 has been changed from positive polarity to negative polarity at (b) is shown.

As shown in FIG. 12, an output voltage pulse signal Uf having a pulse width Tr equal to that of a PWM signal Ur can be obtained by compensating for dead time and delay of the switching element 9.

However, since the corrected PWM signals Up and Un are delayed from the PWM signal Ur to be outputted in the system, differences occur between a phase of the PWM signal Ur and phases of the corrected PWM signals Up and Un; and the differences are not constant. In other words, the PWM signal actually outputted from the PWM signal generating section 7 cannot be managed.

In motor control, since a voltage phase is calculated based on a position (a phase) of a rotor of the motor so that voltage application is performed, when a voltage phase is not outputted as calculated, the value also appears as a voltage error. In a current detecting method which detects motor current synchronized with a timing of a PWM signal, since timings of the corrected PWM signals Up and Un actually outputted to the PWM signal Ur are different (not constant), it is difficult to manage a PWM signal by using a current detecting method such as that described above. Since an output phase voltage of the inverter is handled only with a pulse signal, compensation for a voltage error due to voltage drop at the switching element 9 mainly cannot be achieved. Further, since it is necessary to provide the hardware circuit, increase of an external circuit and increase in cost are inevitable.

Unlike the system realizing compensation by utilizing hardware mentioned above, the system realizing compensation by utilizing software shown in FIG. 13 does not include the abovementioned problems. As shown in FIG. 13, the system is a system where a voltage control loop is disposed inside a current control loop so that control is performed such that a phase voltage follows a voltage command value, and since software is utilized, a timing of a PWM signal to be outputted can be managed.

In the system, however, since a PWM signal output processing involves a significantly large operation load, the system cannot be realized by a general inexpensive microcomputer or the like. Further, since PI control is used for the voltage control, gain adjustment thereof or the like is also required.

As described above, the problems in the conventional system realizing compensation by utilizing hardware and the conventional system realizing compensation by utilizing software lie in that, since a timing of the corrected PWM signal actually applied is different from the outputted PWM signal and the timing is not constant, timing management of a PWM signal when a dead time compensation has been conducted cannot be performed and cost and operation load in a software processing are increased according to increase of an external circuit. It is understood that compensation for voltage error due to voltage drop at the switching element cannot be achieved even by the technique disclosed in Patent Document 3.

Accordingly, the present invention has been made to solve the problems and an object thereof is to provide a control technique of a PWM type power converter which can compensate for a voltage error due to voltage drop mainly at a switching element at the same as managing a switching timing of a PWM signal, and capable of suppressing increase/decrease of software operation load and addition of a hardware circuit to the minimum.

The above and other objects and novel characteristics of the present invention will be apparent from the description of this specification and the accompanying drawings.

The typical ones of the inventions disclosed in this application will be briefly described as follows.

More specifically, a typical one of the inventions is a semiconductor integrated circuit having a PWM signal generating system for generating a PWM signal, and the semiconductor integrated circuit comprises: a counter which counts a pulse width of a pulse signal inputted from the outside with delay from the PWM signal; a register which loads a counter value of the counter in synchronization with the PWM signal; and an A/D converting system for converting an analog signal serving as a source signal of a pulse signal inputted from the outside to a digital signal.

Further, there is realized a semiconductor integrated circuit comprises a storage system storing: a PWM voltage command time value obtained by converting a voltage command value to time data; a PWM setting time value set in a PWM signal generating system; a register value of a register; and an A/D conversion result value of an A/D converting system, where an output voltage value of the power converter is converted to a digital signal in the A/D converting system in the semiconductor integrated circuit, and the register value, the A/D conversion result value, the PWM voltage command time value, and the PWM setting time value are used in a cyclic software processing performed per cycle so as to calculate a PWM setting time value of the next PWM setting time and set the same.

Here, the cyclic processing is performed in synchronization with a carrier cycle of the PWM signal generating system; and the counter, the register and the A/D converting system configure a set and at least one set thereof is provided.

In addition, the counter can count arbitrary levels by making a level of a pulse signal ("Hi" or "Low") to be counted selectable.

The A/D converting system further comprises a circuit which amplifies an inputted analog signal inside, so that a selected signal among the source signal or an amplified signal is A/D-converted. At this time, an amplification gain of the amplifying circuit is set to an even multiple or 1/even-number multiple.

The above-mentioned method of calculating the next PWM setting time values is performed according to the following two stages. Firstly, an error voltage between the A/D conversion result value and a reference direct current voltage value is obtained and a voltage command value obtained by addition with a value corresponding to the error voltage is produced. Secondly, an error between a pulse width time of a pulse signal obtained from the register value and the PWM setting time value is obtained to calculate the next PWM setting time value from the error and the PWM voltage command time value. Alternatively, there is also a method for obtaining an error between the pulse width time and the PWM voltage command time value to calculate the next PWM setting time value from the error and the PWM setting time value.

Further, when a power converting circuit for converting DC power to AC power provided with at least two switching elements is provided together with the PWM signal output device, abnormality of the switching element can be determined by providing a storage system which outputs a signal with a predetermined pattern as a PWM signal, and obtains an error time from the pulse width time at the moment and the PWM setting time value or the PWM voltage command time value to store the error time as a delay time of at least two switching elements.

As described above, by sectioning a processing performed by the hardware circuit and a processing performed according to a software processing from each other, versatility of the semiconductor integrated circuit is maintained and dead time compensation is realized while operation load is reduced. Consequently, addition of an external circuit is suppressed to minimum, timing management of a PWM signal is made possible and operation load can also be reduced.

Further, the present invention can be applied to a PWM signal output device using a semiconductor integrated circuit having a PWM signal generating system, a power conversion control apparatus provided with a PWM signal generating system, a semiconductor integrated circuit, a level detecting system, and a system for inputting its source signal into the semiconductor integrated circuit, and so forth.

The effects obtained by typical aspects of the present invention will be briefly described below.

More specifically, an effect obtained by a typical invention is that a counter function requiring a processing speed, a register function of loading a value of the counter, and a function of A/D-converting an output voltage value of a power converter are provided in a hardware circuit of the semiconductor integrated circuit, and compensation for a voltage error and a setting processing to a PWM timer are performed according to a software processing, thereby managing a switching timing of a PWM signal simultaneously with compensation for a voltage error due to voltage drop mainly at the switching element and increase of software operation load and addition of a hardware circuit can be suppressed to minimum. Consequently, output voltage compensation and dead time compensation are made possible by a simple circuit configuration and a software processing.

As another effect obtained by the typical invention, versatility of the semiconductor integrated circuit can be maintained so that an inexpensive semiconductor integrated circuit is realized.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that, components having the same function are denoted by the same reference symbols throughout the drawings for describing the embodiment, and the repetitive description thereof will be omitted.

First Embodiment

In a present embodiment, an example such that, in setting of a PWM timer where a conduction ratio of an upper arm side of a PWM signal increases as a PWM setting time decreases, "Hi" level of an output voltage pulse signal is an ON period of the upper arm side and the "Hi" levels are counted is shown. This is called a first case.

Figure 1:
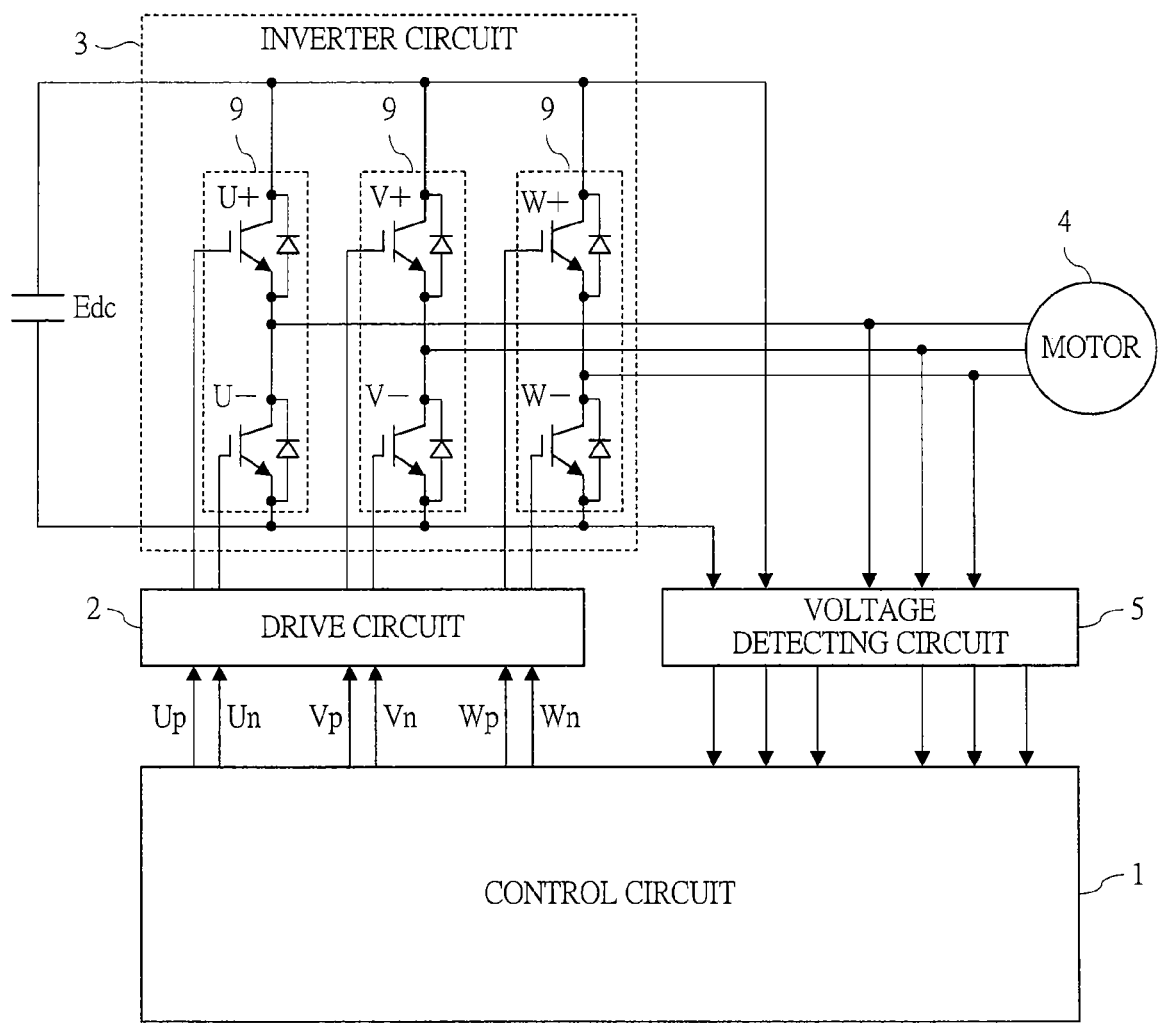
FIG. 1 is an overall configuration diagram showing a motor drive apparatus according to a first embodiment of the present invention.

First, a first embodiment of a power conversion control apparatus according to the present invention will be described. FIG. 1 is an overall configuration diagram of a motor drive apparatus which is the power conversion control apparatus. The motor drive apparatus (power conversion control apparatus) according to the first embodiment comprises: a control circuit (PWM signal output device) 1 using a microcomputer (semiconductor integrated circuit); a drive circuit 2 which amplifies a PWM signal outputted from the control circuit 1 to drive switching circuits 9 in an inverter circuit 3 described later; the inverter circuit (power converting circuit) 3 comprising the switching circuits 9; a motor 4; a voltage detecting circuit 5 which outputs a level of an output voltage of the inverter circuit 3 as an output voltage pulse signal and outputs an output voltage value as a phase voltage signal; and so forth. A DC voltage Edc is applied to the inverter circuit 3.

Figure 2:
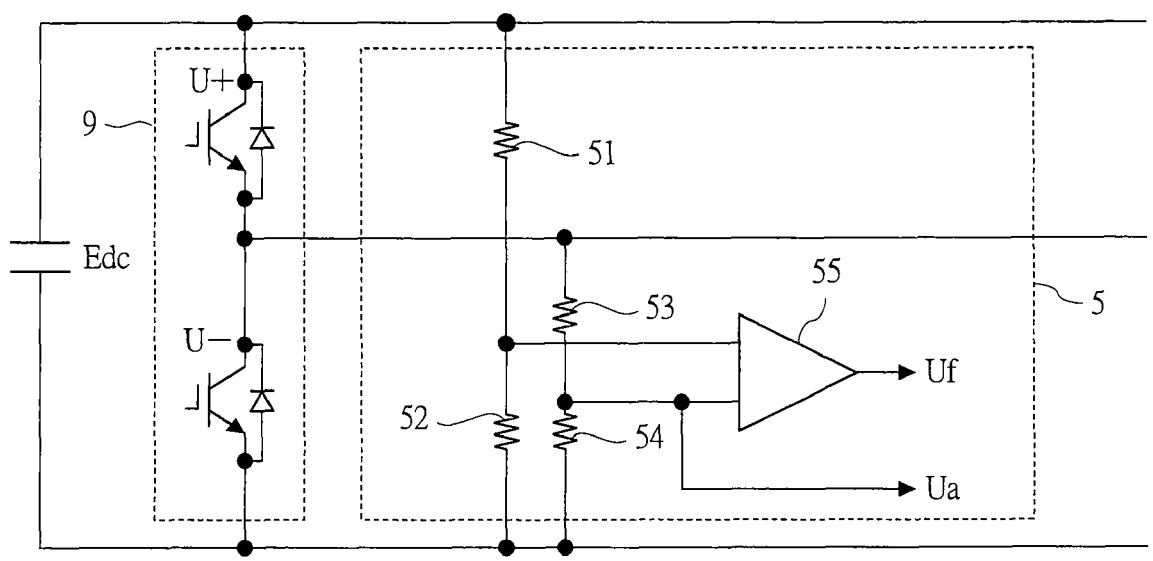
FIG. 2 is a configuration diagram showing a voltage detecting circuit according to the first embodiment of the present invention.

FIG. 2 is a circuit configuration diagram (for one phase (U-phase)) of the voltage detecting circuit 5 mentioned above. The voltage detecting circuit 5 comprises resistors 51 to 54, a comparator 55 and so forth, and it compares the DC voltage Edc and a terminal voltage with each other to output an output voltage pulse signal Uf and to output an output voltage signal Ua.

Figure 3:
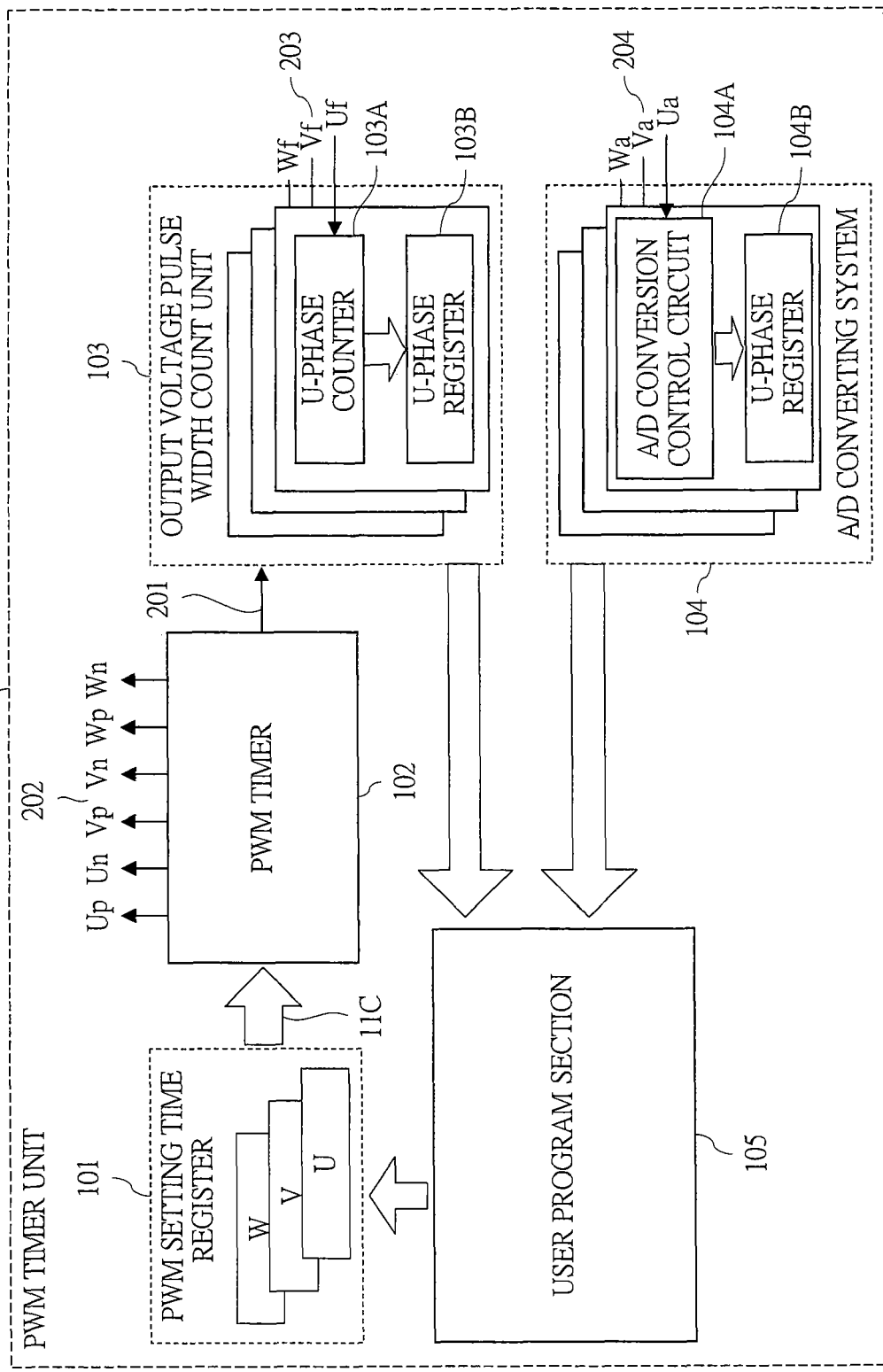
FIG. 3 is a schematic internal configuration diagram showing a PWM timer unit according to the first embodiment of the present invention.

FIG. 3 is a schematic internal configuration diagram of a PWM timer unit (PWM signal generating system) 100 provided in the control circuit 1. The PWM timer unit 100 comprises: a PWM setting time register 101; a PWM timer 102 which compares a value of the PWM setting time register 101 and a triangle wave carrier signal with each other to output a six-phase complementary PWM signal 202; an output voltage pulse width count unit 103 having a counter 103A for counting an output voltage pulse width of an output voltage pulse signal 203 inputted from an external terminal and a register 103B for loading a value of the counter 103A according to a trigger signal 201 from the PWM timer 102; an A/D converting system 104 having an A/D conversion control circuit 104A for converting a phase voltage signal (analog signal) 204 inputted from an external terminal to a digital signal and a register 104B to which the A/D conversion result is stored; a ROM 105 for saving a user program and the like, etc.

The counter 103A includes level selecting system for allowing selection of levels of a pulse signal to be counted.

The register 103B has a function such as a loading cycle selecting system for loading a counter value of the counter 103A in synchronization with the carrier signal to allow selection of loading cycles.

The A/D converting system 104 starts an A/D conversion utilizing a timing where levels of the output voltage pulse signal 203 changes and a timing where levels of the complementary PWM signal 202 changes, etc. as a trigger. Note that, it is effective that the A/D converting system 104 continuously performs A/D conversions.

Figure 4:
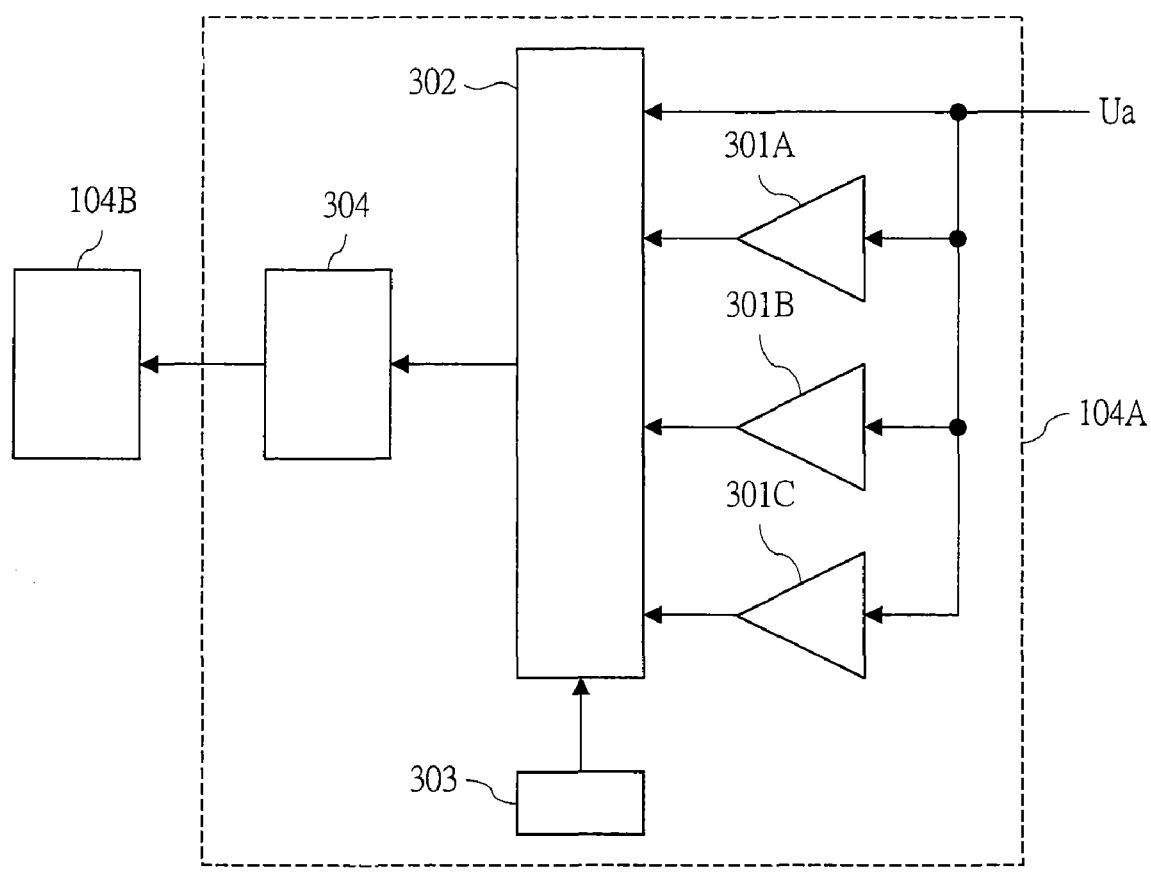
FIG. 4 is an internal configuration diagram showing an A/D conversion system according to the first embodiment of the present invention.

FIG. 4 is an internal configuration diagram (showing one phase (U-phase)) of the A/D converting system 104. An inputted phase voltage signal Ua is inputted into an amplification gain selecting system 302 as it is or through an amplifier. The input signal is either one of four kinds of signals: (a signal as it is (one multiple); a signal which has passed through an amplifier 301A with amplification gain 2 (two multiple); a signal which has passed through an amplifier 301B with amplification gain 4 (four multiple); and a signal which has passed through an amplifier 301C with amplification gain ½ (½ multiple)). It is preferable that the gain of the amplifier is even multiple or 1/even-number multiple in view of mounting on the semiconductor integrated circuit, but another amplification gain can be adopted. The amplification gain selecting system 302 outputs a desired input value selected from a plurality of input values to an A/D conversion control system 304 according to a setting made by an amplification gain setting register 303. The A/D conversion control system 304 converts an inputted analog signal to a digital signal to store the converted result in the register 104B.

The control circuit 1 includes an ordinary function block configuring a microcomputer such as a CPU or a RAM (storage system) not shown in addition to the PWM timer unit 100. The ROM stores therein a PWM voltage command time value obtained by converting a voltage command value to time data, a PWM setting time value set in the PWM timer unit 100, a register value of the register 103B, an A/D conversion result value of the A/D converting system 104, and the like.

Here, in the present embodiment, while the counter 103A is set as an up counter, it may be set as a down counter. At this time, an output voltage pulse width Tf operation described later is different.

The PWM setting time register 101, the output voltage pulse width count unit 103, and the A/D converting system 104 form a three set configuration for U-phase, V-phase, and W-phase.

A loading cycle of a counter value to the register 103B is determined by a trigger signal 201 and it can be selected from three types: a peak; a trough; and both peak and trough of a triangle wave carrier signal. In the present embodiment, the loading cycle is set to both the peak and trough. A clock of the counter 103A can be selected. However, it is desirable that the clock is set to the same as the clock of the PWM timer 102 or even multiple or 1/even-number multiple of the clock of the PWM timer 102.

An actual PWM timer unit 100 comprises many registers such as various setting registers or a time setting register for dead time, but a specific configuration thereof is omitted to describe in the present embodiment.

Figure 5:
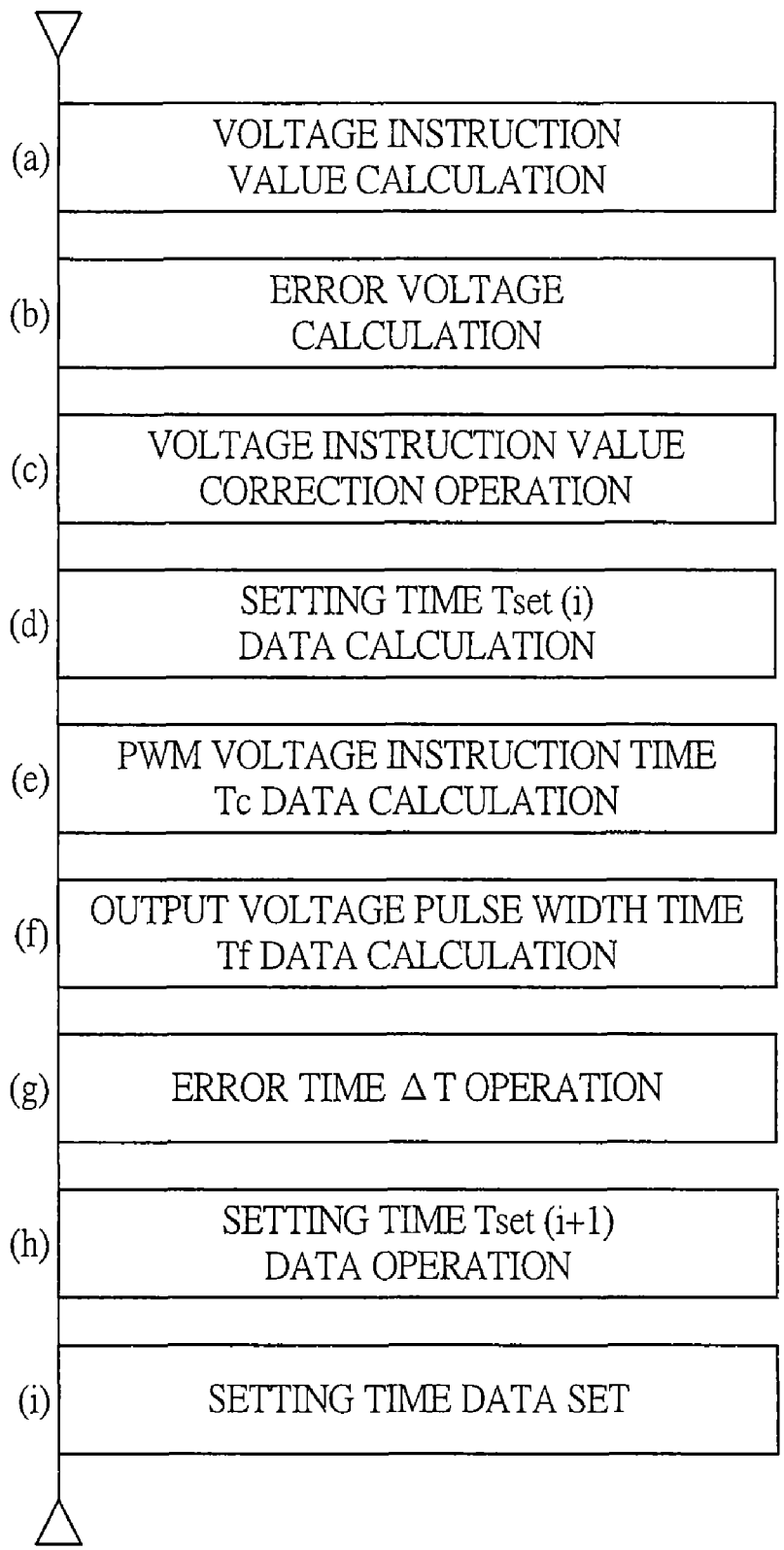
FIG. 5 is a schematic flowchart showing a dead time compensation method according to the first embodiment of the present invention.

FIG. 5 is a schematic flowchart of dead time compensating method realized using the PWM timer unit 100 shown in FIG. 3. The processing (steps (a) to (i)) is an interruption processing performed by interruption generating system activated at a PWM carrier signal cycle. In the present embodiment, description is made using a trough interruption processing. Respective processings in the dead time compensating method are controlled based on a control program executed by a CPU configuring a microcomputer. The processings explained below must be performed corresponding to respective phases, but since the processings to respective phases are the same, only one phase (U-phase) is explained here.

At step (a), calculation of a three-phase voltage command value outputted by the inverter circuit 3 is performed. As a method for calculating a three-phase voltage command value, since various methods are known, a specific explanation thereof is omitted.

At step (b), an error voltage of an output voltage of the inverter is obtained. When a complementary PWM signal is produced, a DC voltage Edc connected to the inverter circuit 3 is outputted from the inverter 3 as it is. However, a DC voltage actually outputted is smaller than the DC voltage Edc due to voltage drop caused by the switching element 9. However, an inverter output voltage value when respective upper and lower switching elements 9 are ON is detected, an actual phase voltage outputted from the inverter is obtained, and an error voltage of an output voltage is obtained. An operation Expression is as follows:

$$\Delta Von = Edc - (Vau - Val) \quad (1)$$

Here,

ΔVon: error voltage value from reference DC voltage value;
Edu: reference DC voltage value;
Vau: inverter output voltage value when upper arm is ON; and
Val: inverter output voltage value when lower arm is ON.

At step (c), correction of a voltage command value is performed using the error voltage obtained at step (b) in a manner as the following Expression.

$$V^{**} = V^* + \Delta Von \quad (2)$$

Here,

V*: voltage command value (calculated at step (a)); and
V**: voltage command value after compensated.

At step (d), calculation of PWM setting time Tset(i) data for error time operation is performed from time data set in the PWM setting time register 101. Here, an average value of a current value actually set in the PWM setting time register 101 and a set value at previous interruption time (saved in RAM at the previous processing time) is calculated. The current value is stored in the RAM as a previous value to be used at the next operation time.

Here, the average value is obtained because even if setting is performed in the PWM setting time register 101, a difference of a half cycle occurs until the set value is actually reflected in the PWM timer 102 to be outputted. In other words, this is because, in a cycle where the set value has been changed, PWM signals of the previous set value and the current set value are outputted half and half. Note that, when data is reflected in the PWM timer 102 as soon as the PWM setting time data has been set, it is unnecessary to calculate the average value and the current value is only necessary.

At step (e), calculation of a PWM voltage command time Tc which is a time conversion value is performed from the compensated voltage command value calculated at step (c). Here, time data corresponding to a voltage command is calculated from a relationship between a PWM carrier frequency and a clock frequency of the PWM timer 102.

At step (f), an output voltage pulse width time Tf is calculated.

At step (g), an error time $\Delta T$ is calculated, and a set time Tset(i+1) to be set in the PWM setting time register 101 is calculated at Step (h).

Here, calculating methods at steps (g) and (h) vary according to setting of the PWM timer 102 and level setting of the output voltage pulse signal to be measured.

Specifically, there are four kinds of combinations regarding a relationship of large and small of the PWM setting time and, for example, large and small of the conduction ratio on the upper arm side, and a relationship between levels of the output voltage pulse signal and the ON period on the upper arm side or the lower arm side.

In the present embodiment, as a first case, in setting of the PWM timer where the conduction ratio of the PWM signal on the upper arm side increases as the PWM setting time is decreased, when "Hi" level of the output voltage pulse signal is ON period on the upper arm side and the "Hi" level is counted, the time data set in the PWM setting time register corresponds to an ON time on the upper arm side of PWM and an output voltage pulse signal counter value is obtained by counting the ON time on the upper arm side of PWM. Therefore, considering the above content, it is necessary to conduct operations of steps (g) and (h). The following is one example of the operations. Here, the PWM voltage command time is obtained by calculating the ON time on the upper arm side.

As the first case which is a setting in the present embodiment, operation can be performed in the following manner.

$$\Delta T(i)on = Tc(i+1)on - Tf(i)on \quad (3)$$

$$Tset(i+1)off = Tset(i)off - \Delta T(i)on \quad (4)$$

or $$\Delta T(i)on = [1 - Tset(i)off] - Tf(i)on \quad (5)$$

$$Tset(i+1)off = Tc(i+1)on + \Delta T(i)on \quad (6)$$

Here,

ΔT(i)on: error time (ON time-based on upper arm side);
Tc(i+1)on: PWM voltage command time value after updated (ON time-based on upper arm side);

Tf(i)on: output voltage pulse width time value (ON time-based on upper arm side);

Tset(i)off: PWM setting time value (OFF time-based on upper arm side); and

Tset(i+1)on: PWM setting time value to be updated (OFF time-based on upper arm side).

As a second case, there is such a case that the PWM timer setting is the same as the above and "Lo" level of the output voltage pulse signal is counted. As a third case, there is such a case that, in setting of the PWM timer where the conduction ratio of the PWM signal on the upper arm side decreases as the PWM setting time is decreased, which is different from the first and second cases, "Hi" level of the output voltage pulse signal is an ON period on the upper arm side and the "Hi" level is counted. As a fourth case, there is such a case that the PWM timer setting is the same as that in the third case, "Low" level of the output voltage pulse signal is an ON period on the lower arm side, and the "Low" level is counted. According to setting of the PWM timer, level for measuring the output voltage pulse signal, and the PWM voltage command time value like the above, there are various combinations of operation methods, where each method can be performed utilizing only add-subtract and a complicated operation processing is not required. In other words, operation load is small and realization is facilitated even using a general inexpensive microcomputer. Setting of the PWM timer and measuring level of the output voltage pulse signal are fixed when the configuration of the system is determined, and no change is made during operation so that the operation method can be determined to one.

Here, since setting is performed utilizing the first case in the present embodiment, the error time $\Delta T$ is calculated at step (g) by subtracting the output voltage pulse width time Tf calculated at step (f) from the setting time calculated at step (d) according to the Expression (5). Alternatively, the error time $\Delta T$ may be calculated by subtracting the output voltage pulse width time Tf calculated at step (f) from the PWM voltage command time Tc calculated at step (e) according to the Expression (3). In this case, the next step (h) has a different operation.

At step (h), a setting time to be set in the PWM setting time register 101 is calculated from the error time $\Delta T$ calculated at step (g) and the PWM voltage command time Tc calculated at step (e) according to the Expression (6). Alternatively, the setting time to be set in the PWM setting time register 101 is calculated from the error time $\Delta T$ calculated at step (g) and the PWM setting time calculated at step (d) according to the Expression (4).

At step (i), the setting time calculated at step (h) is set in the PWM setting time register 101.

Figure 6:
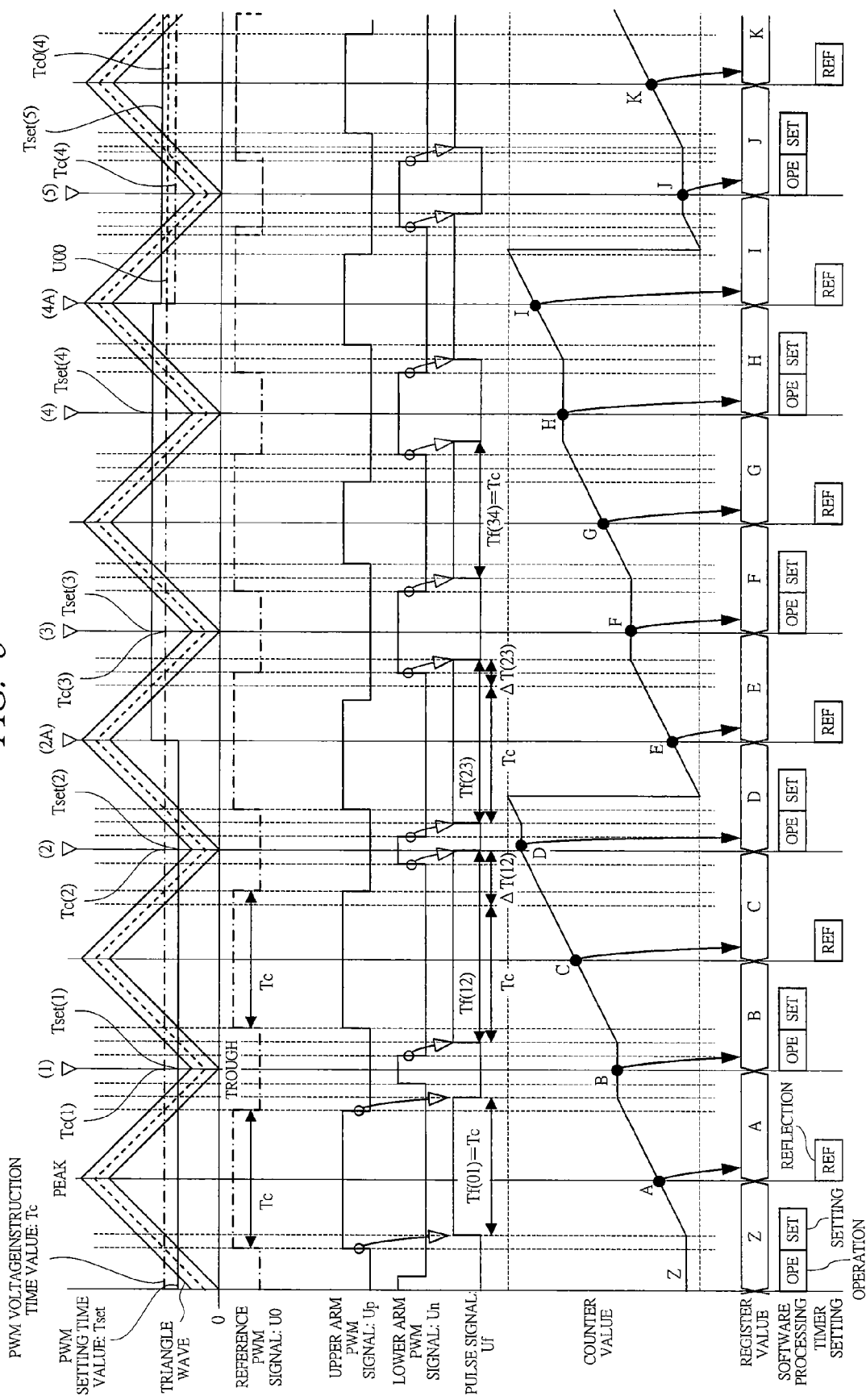
FIG. 6 is a time chart showing the dead time compensation method in operation according to the first embodiment of the present invention.

FIG. 6 is a time chart in an operation of the dead time compensating method. A triangle wave carrier signal for PWM generation is described with a double carrier system including two triangle waves different in only dead-time time interval. To obtain a waveform when dead time is not added for consideration, a triangle wave signal (dotted line) is described at the center of a double carrier.

FIG. 6 shows, from the top: a PWM voltage command time value Tc (a dashed-dotted line) calculated based on a voltage command value after error voltage compensation; a PWM voltage command time value Tc0 (a dotted line) calculated based on the voltage command value; a PWM setting time value Tset (a solid line) actually compared with a triangle wave; a triangle wave of a double carrier; a reference PWM signal U00 (a dotted line) originally desired to be outputted which is obtained by comparing the PWM voltage command time value Tc0 and the reference triangle wave signal with each other; a PWM signal after error voltage compensation U0 (a dashed-dotted line) obtained by comparing the PWM voltage command time value Tc and the reference triangle wave signal with each other; an upper arm PWM signal Up and a down arm PWM signal Un outputted actually by comparing the PWM setting time value Tset and the double carrier signal with each other; an output voltage pulse signal Uf obtained from the voltage detecting circuit 5; and a counter value counting "Hi" level pulse width of the output voltage pulse signal together with actual reflection timing to a software processing and the PWM timer.

The loading timing of the counter value to the register is set to both cycles of the peak and the trough of the PWM carrier. The PWM timer performs operation of a set value, setting of the set value to the register and the like at a trough cycle interruption processing of the PWM carrier, and setting is performed such that the set value is reflected in the register where the comparison with a triangle wave signal at a top period of the PWM carrier is actually performed.

Note that, compensation for the error voltage and adjustment of the pulse width are simultaneously performed and respective descriptions thereof will be made in the present description.

First, adjustment of the pulse width from a timing (1) to a timing (4) will be described. For convenience of description, it is assumed that a DC voltage value during the period takes an ideal value (namely, the reference DC voltage value Edc) and it is not fluctuated. That is, the reference PWM signal U00 originally desired to be outputted and the PWM signal after error voltage compensation U0 are equal to each other. Illustration of the PWM voltage command time value Tc0 calculated based on the reference PWM signal U00 and that of the voltage command value during this period is omitted.

A state before the timing (1) shows a state where the motor current polarity is positive and the inverter output voltage depends on the upper arm PWM signal Up, and the voltage error and the dead time, and delay of the switching element or the like has been already compensated so that the pulse width time Tc0 of the reference PWM signal U00 originally desired to be outputted and the pulse width time Tc of the PWM signal after error voltage compensation U0, and the pulse time width Tf(01) of the output voltage pulse signal Uf are equal to each other. Here, when the motor current changes from a positive polarity to a negative polarity at the timing (1), the inverter output voltage follows the lower arm PWM signal Un so that the pulse time of the output voltage pulse signal Uf increases by the dead time after the timing (1).

At the timing (2), the processing explained in FIG. 5 is performed to calculate and set the setting time Tset(3).

Specifically, as shown in the step (d) in FIG. 5, first, the current setting time data is calculated. In FIG. 6, an average value of the setting time data Tset(1) at the timing (1) which is the previous interruption cycle and the setting time data Tset(2) at the timing (2) which is the present interruption cycle is calculated, so that the average value is used as the current setting time data Tset(12). Since the setting time data does not change at the timing (2), even if the average value is calculated, the same value is obtained.

Next, as shown in step (e) in FIG. 5, the PWM voltage command time Tc is calculated from the voltage command value. In FIG. 6, the PWM voltage command time Tc is Tc(2). In the present embodiment, since the voltage command value is constant, the Tc(2) takes the same value.

Next, as shown in step (f) in FIG. 5, the output voltage pulse width Tf is calculated. In FIG. 6, an output voltage pulse width Tf(12) is calculated by subtracting a register value B saved in the RAM at the timing (1) from a register value D loaded from the counter at the timing (2). The counter value C is also automatically loaded to the register, but it is not used at the operation method at this time.

Next, at the step (g) in FIG. 5, as explained in FIG. 5, there are two kinds of operation methods; when following the Expression (1), the error time ΔT(12) is obtained by subtracting the output voltage pulse width Tf(12) from the PWM voltage command time Tc(2). Since the operation method has followed the Expression (1), the setting time Tset(3) is calculated at the step (h) in FIG. 5 by subtracting the error time ΔT(12) calculated above from the setting time data Tset(12) calculated above according to the Expression (2). This value is set in the register of the PWM timer as shown at the step (i) in FIG. 5. Here, though descriptions about the case according to the Expressions (3) and (4) described in FIG. 5 is omitted, the operation can be performed by a similar method.

The setting time Tset(3) set above is actually reflected at a timing (2A) in FIG. 6 and the PWM signal is changed at the time. Therefore, as the setting time data for the period from the timing (2) to the timing (3), an average value of the setting time data Tset(2) and the setting time data Tset(3) is a correct value. Here, when the next setting time data Tset(4) is calculated at the time of the timing (2A) using the setting time data Tset(3) without regarding the above-described flow, the PWM voltage command time value Tc and the output voltage pulse width Tf(34) does not match with each other in the period from the timing (3) to the timing (4), as shown in FIG. 6, which results in occurrence of a slight error. However, the matching can be finally obtained even in this method. In other words, in a system where the voltage command value is not changed frequently, it is unnecessary to calculate the average value, but it is desirable to calculate the average value in a system where the voltage command value is changed momentarily. Note that, since the PWM voltage command time value Tc is calculated for each operation cycle, it is unnecessary to take an average value.

By conducting the above operations, while the PWM signal after error voltage compensation U0 and the output voltage pulse signal Uf are not equal to each other in the period from the timing (1) to the timing (3), the reference PWM signal U00 originally desired to be outputted and the output voltage pulse signal Uf become equal to each other in the period from the next timing (3) to the timing (4), so that even if the polarity of the current changes, the PWM signal is corrected and a voltage value desired to be outputted can be outputted.

Next, a procedure of the voltage correction in the period from the timing (4) to the timing (5) will be described. For convenience for explanation, it is assumed that change of a switching timing such as change of current polarity does not occur, so that a description of the pulse width adjustment will be omitted.

As shown at the step (b) in FIG. 5, an error voltage is first calculated. A phase voltage detection is performed at a timing described later, and the error voltage is obtained using a difference between the difference of the inverter output voltage value and the difference of the reference DC voltage value when the upper and lower switching elements are ON, respectively.

Next, as shown at the step (c) in FIG. 5, a voltage command value after compensation is obtained. The voltage command value after compensation conducts the processing from the step (d) to the step (i), and it is actually reflected at a timing (4A) in FIG. 6. As a result, the width of the PWM signal after error voltage compensation U0 is made wide with respect to the reference PWM signal by a size corresponding to the voltage error due to voltage drop caused by the switching element or the like.

Figure 7:
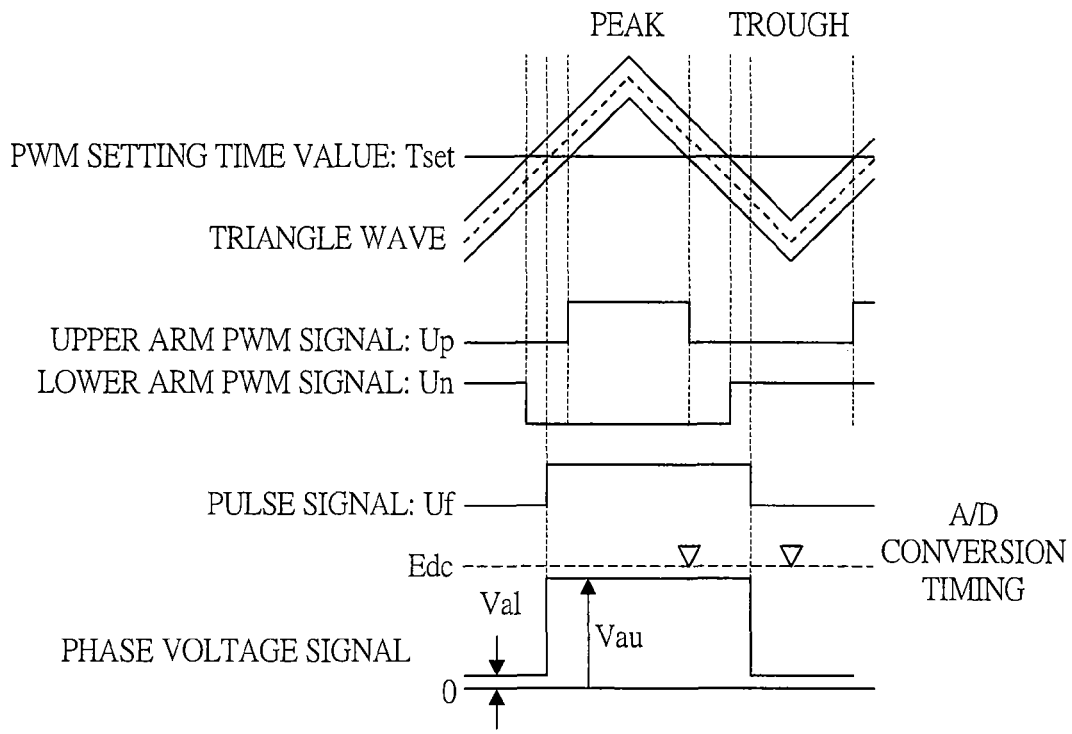
FIG. 7 is a time chart showing a first example of A/D conversion timing according to the first embodiment of the present invention.

Some timings of the phase voltage detection are possible depending on the operation of the A/D converting system 104. For example, when A/D conversion is performed one time regarding each of the phase voltage when the upper arm is ON and the phase voltage when the lower arm is ON, an output phase voltage when the upper arm is ON is detected by conducting A/D conversion in synchronization with the upper arm PWM signal Up and an output phase voltage when the lower arm is ON is detected by conducting A/D conversion in synchronization with the timing of the trough as shown in FIG. 7.

Figure 8:
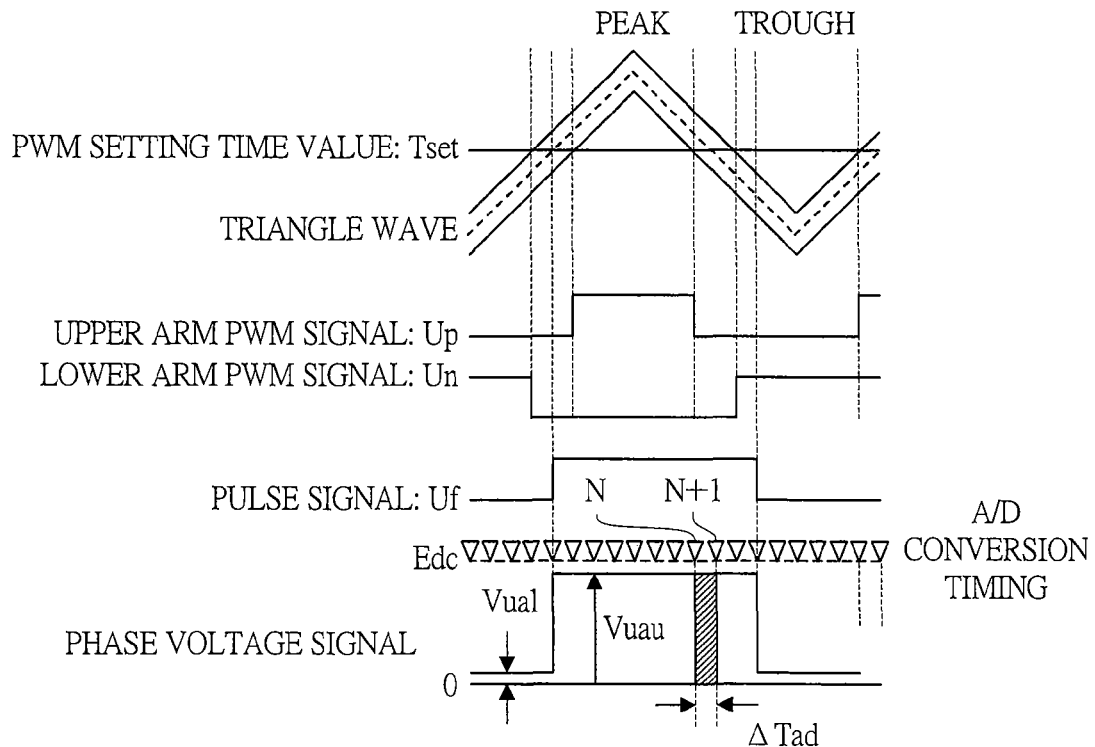
FIG. 8 is a time chart showing a second example of A/D conversion timing according to the first embodiment of the present invention.

On the other hand, FIG. 8 shows a case where the A/D converting system 104 is operated continuously. The average value of the A/D conversion result when the pulse signal Uf is "Hi" is used as the phase voltage when the upper arm is ON and the average value of the A/D conversion result when the pulse signal Uf is "Low" is used as the phase voltage when the lower arm is ON.

In addition, regarding a case where the A/D converting system 104 is operated continuously, voltage correction can be performed by obtaining an area in a minimal time to integrate the area. In this case, how to obtain the PWM voltage command time value Tc at the step (e) in FIG. 5 is changed. First, an area ΔV(N) of a minimal time is obtained at step (b) according to the following Expression (7).

$$\Delta V(N) = (V(N) + V(N+1))/2 \times \Delta Tad \quad (7)$$

Here,

ΔV(N): minimal area of phase voltage detected between N-th and (N+1)-th A/D conversion triggers;

V(N): A/D conversion result of a phase voltage value detected at N-th A/D conversion trigger;

V(N+1): A/D conversion result of a phase voltage value detected at (N+1)-th A/D conversion trigger; and ΔTad: A/D conversion interval.

Next, at step (c), the minimal area is integrated by one cycle of the PWM carrier and voltage value Vsum outputted from the inverter during one cycle of the PWM carrier is obtained.

Thereafter, at step (d), the PWM voltage command time value Tc is obtained using the PWM voltage command time value Tc0 calculated based on the voltage value Vsum and the voltage command value calculated at the step (a) in the following manner.

$$Tc = Tc0 + (Edc \times Tc0 - Vsum)/Edc \quad (8)$$

Here,

Edc: voltage value of DC voltage.

That is, the PWM voltage command time value becomes large by an amount corresponding to an error voltage so that a voltage outputted from the inverter becomes large.

By using the above-described embodiment, compensation for dead time of the inverter circuit and delay of the switching element can be achieved, a voltage error can be prevented from occurring, and distortion of motor current can be eliminated. In the present embodiment, measurement of output voltage pulse width time requiring a processing speed uses a counter function, a register function, and an A/D conversion function embedded in a microcomputer and a processing requiring to manage a timing of a PWM signal or the like is performed by a software processing, so that a system with high versatility which can realize compensation for voltage error due to voltage drop mainly at the switching element and flexible dead time compensation can be realized at the same time. In other words, by selectively using a hardware processing and a software processing, a microcomputer which is not reduced in versatility can be realized and dead time compensation capable of managing a switching timing can be realized.

In the embodiment described above, regarding the first case, while an example has been shown according to the Expressions (3) and (4) or the Expressions (5) and (6), these Expressions can be applied to the second case, the third case, and the fourth case. Further, the present invention is also applicable to a case where the relationship between the "Hi" level or "Low" level of the output voltage pulse signal and the upper arm side ON or the lower arm side ON is reversed.

Second Embodiment

Regarding a second embodiment of the power conversion control apparatus (motor driving apparatus) according to the present invention, variation measurement and failure diagnosis of switching speeds at respective phases will be described with reference to FIGS. 9 and 10.

In the present embodiment, in a setting of a PWM timer where a conduction ratio of a PWM signal on an upper arm side increases as a PWM setting time is decreased, when "Hi" level of the output voltage pulse signal is ON period on the upper arm side and the "Hi" level is counted, time data set in a PWM setting time register corresponds to an ON time on the upper arm side of the PWM and an output voltage pulse signal counter value counts the ON time on the upper arm side of the PWM. A loading timing of a counter value into the register is set to both cycles of top and trough of a PWM carrier.

Figure 9:
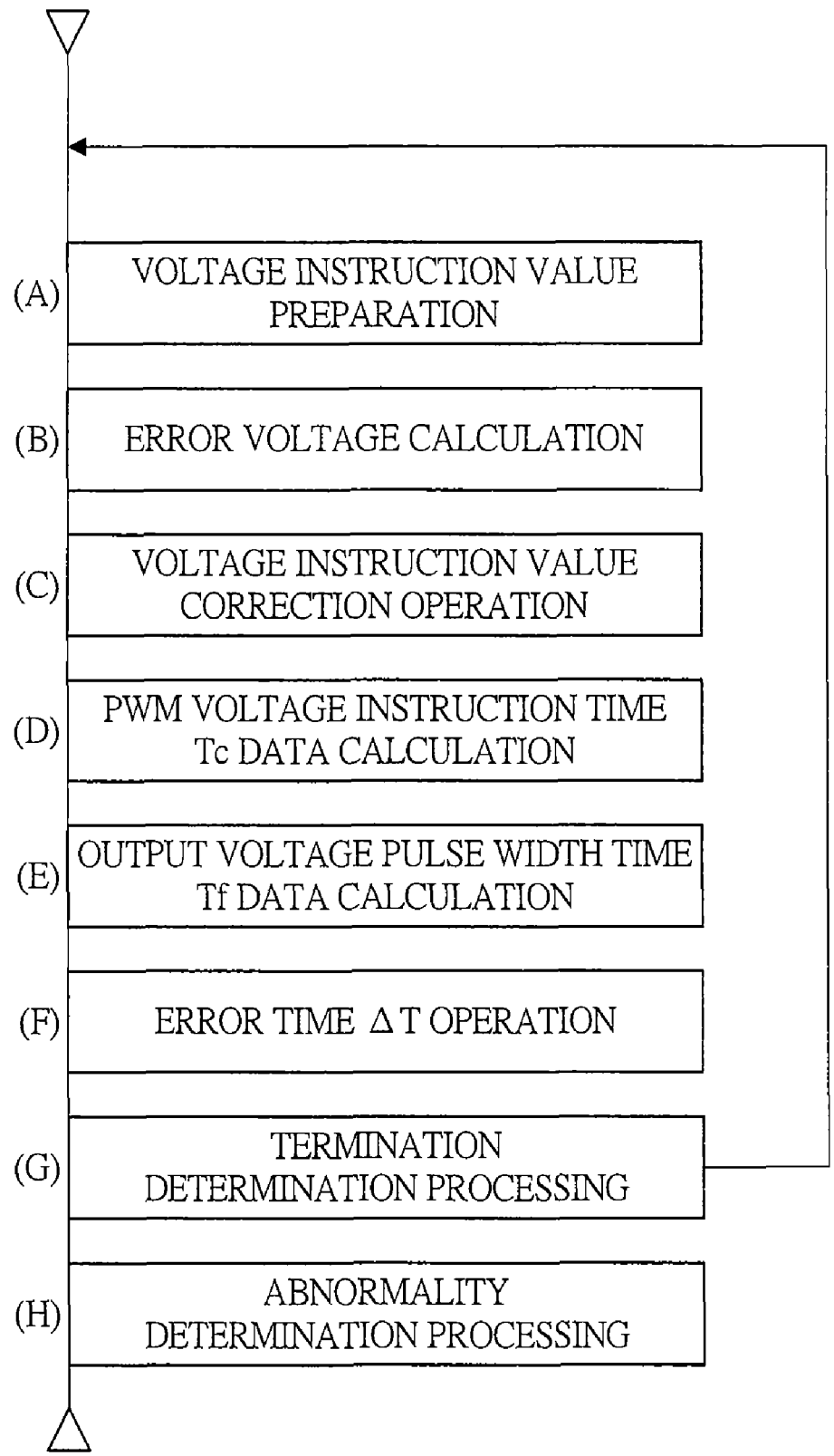
FIG. 9 is a schematic flowchart showing a variation measuring method of a switching speed according to a second embodiment of the present invention.

FIG. 9 is a schematic flowchart of a variation measuring method of a switching speed.

At a step (A), a three-phase voltage command value is prepared in the following manner.

$$Vu^* = Vm \quad (9)$$

$$Vv^* = -Vu^*/2 \quad (10)$$

$$Vw^* = -Vu^*/2 \quad (11)$$

Here,

Vm: voltage command value for measurement.

Figure 10:
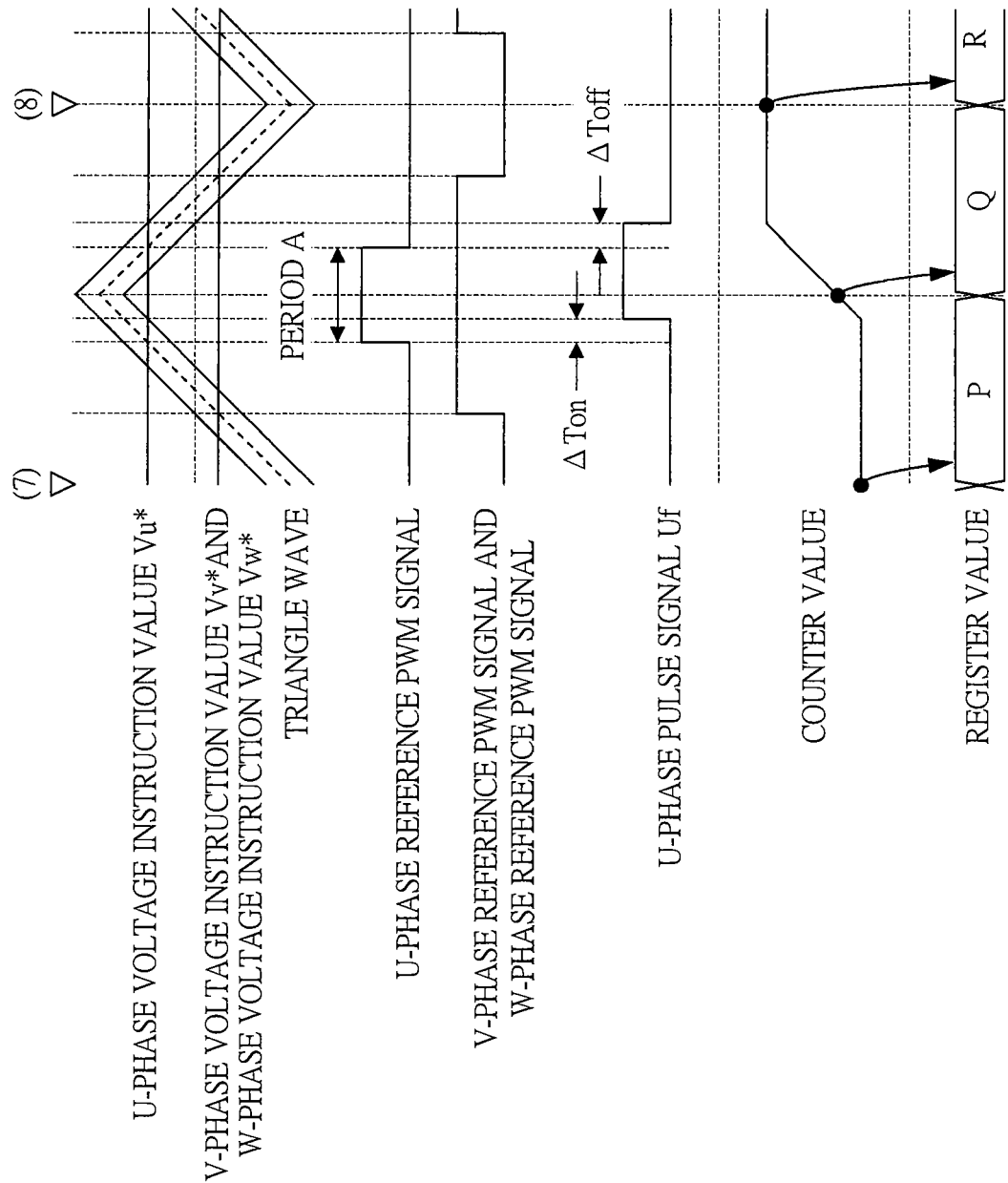
FIG. 10 is a time chart showing an operating time of the variation measuring method of a switching speed according to the second embodiment of the present invention.
Figure 11:
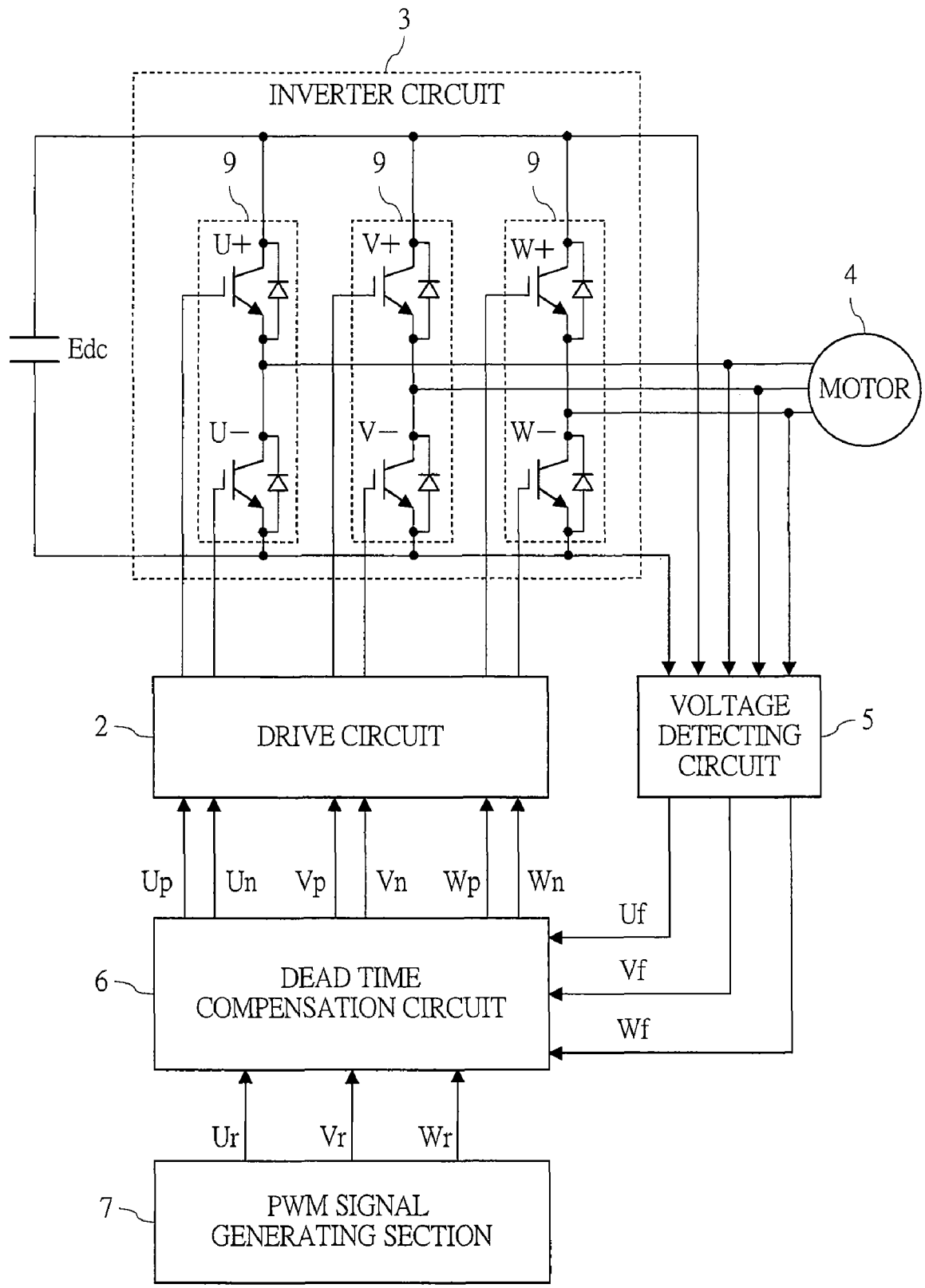
FIG. 11 is an overall configuration diagram showing a motor drive apparatus realized by hardware studied as a premise of the present invention.
Figure 12:
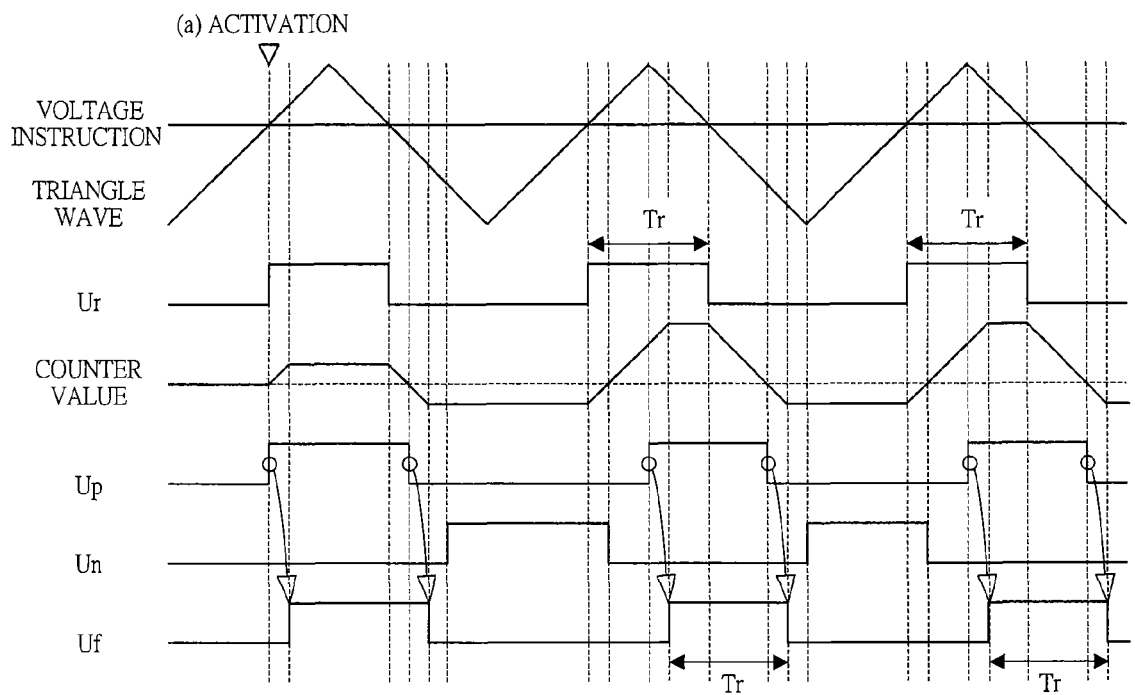
FIG. 12 is a time chart showing FIG. 11 in operation studied as a premise of the present invention.
Figure 12:
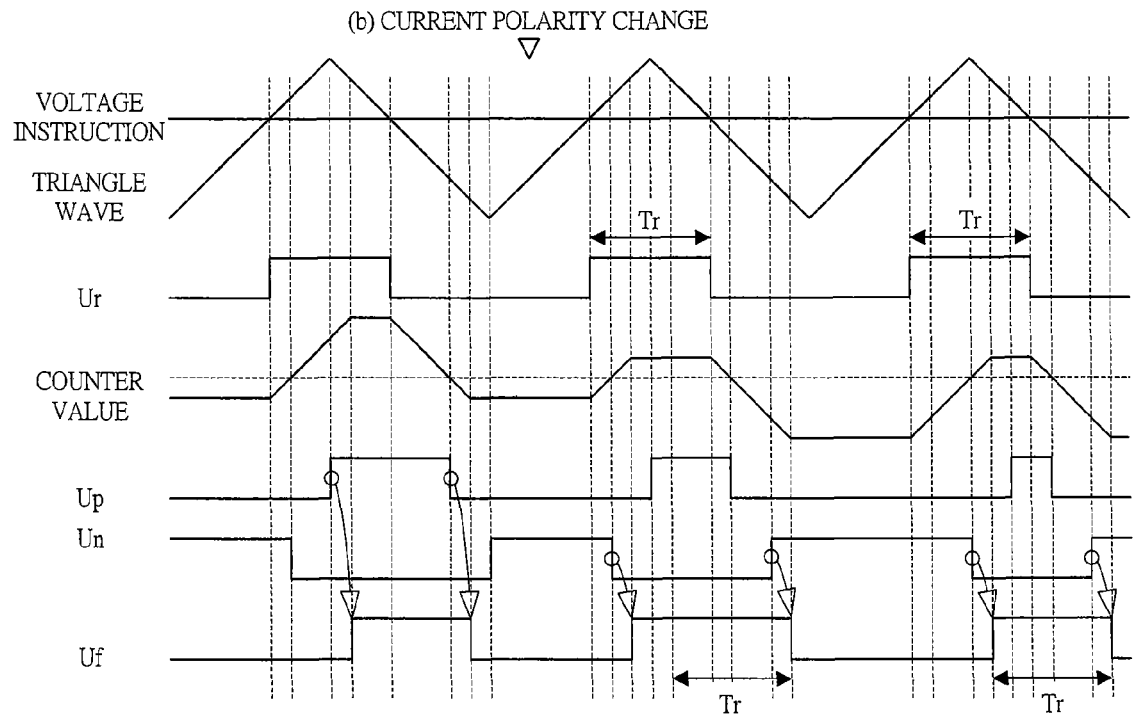
Figure 13:
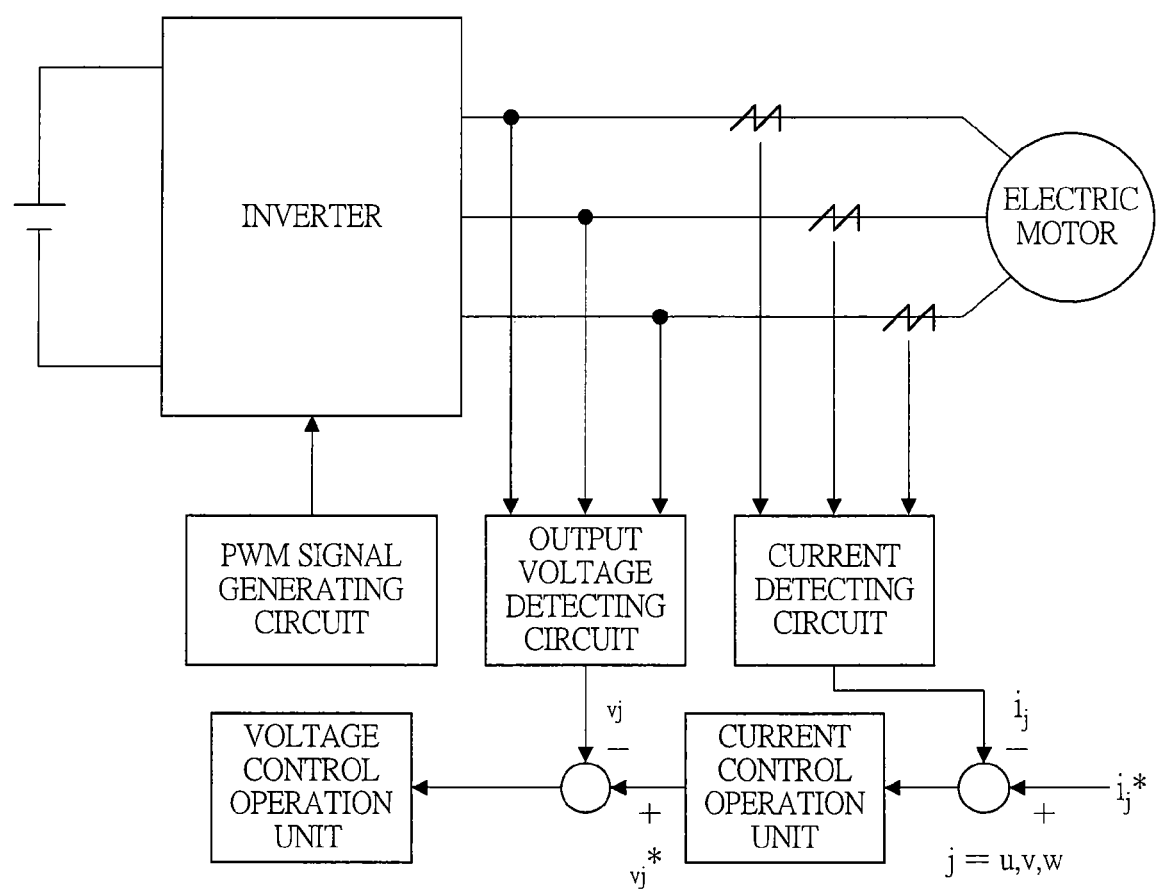
FIG. 13 is a block diagram showing a motor drive apparatus realized by software studied as a premise of the present invention.

When a three-phase voltage command value is provided as the above Expressions, voltage command values and waveforms of a reference PWM pulse signal of respective phases are as shown in a time chart of FIG. 10. During a period A in FIG. 10, only the switching element for the upper arm of U-phase is ON and a current polarity of the U-phase is positive. A pulse width time at this moment is measured and stored. Note that, in FIG. 10, an output voltage pulse width time is measured by subtracting a register value P saved in the RAM at a timing (7) from a register value R loaded from the counter at a timing (8). The processing from the step (B) to the step (E) is similar to the processing from the step (b) to the step (f) in FIG. 5 according to the first embodiment.

Thereafter, while the error time ΔT is obtained at step (F), since this method is the same as the step (g) in FIG. 5 according to the first embodiment, descriptions thereof will be omitted. The error time ΔT is saved in the RAM.

Next, whether or not switching speeds of all phases have been measured is determined at step (G). If the determination is negative, the same processing from the step (A) is performed to each phase. Here, when a measurement voltage −Vm is further applied and the "Low" level of the output voltage pulse signal at this moment is counted to measure the pulse width time, the switching characteristic of the lower arm can be obtained.

If the error time of each phase can be stored as a delay time value, the processing proceeds to an abnormality determining process of step (H). At the step (H), the error time for each phase is compared with a preset reference value, and when the error time is out of the preset reference value, failure of the driver circuit or the switching element is determined.

By using the second embodiment describe above, compensation for dead time of the inverter circuit and delay of the switching element can be achieved, a voltage error can be prevented from occurring, and distortion of motor current can be eliminated like the first embodiment. Output voltage pulse width time measurement requiring a processing speed uses a counter function, a register function, and an A/D conversion function embedded in a microcomputer, and a processing requiring to manage a timing of a PWM signal or the like is performed by a software processing, so that a system with high versatility which can realize compensation for voltage error due to voltage drop mainly at the switching element and flexible dead time compensation simultaneously can be realized. In other words, by selectively using a hardware processing and a software processing, a microcomputer which is not reduced in versatility can be realized and dead time compensation which can manage a switching timing can be realized.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a PWM signal generating technique of a power converter, and in particular it is effectively applied to a control apparatus of a PWM type power converter for compensating for an applied voltage error due to dead time and delay of a switching element, and the like.

What is claimed is:

1. A semiconductor integrated circuit having a PWM signal generating system for generating a PWM signal, comprising
a counter which counts a pulse width of a pulse signal inputted from the outside with delay from the PWM signal;
a register which loads a counter value of the counter in synchronization with the PWM signal; and
an A/D converting system for converting an analog signal serving as a source signal of a pulse signal inputted from the outside to a digital signal.

2. The semiconductor integrated circuit according to claim 1, wherein the counter, the register, and the A/D converting system configure a set and at least one set of the counter, the register, and the A/D converting system is provided.

3. The semiconductor integrated circuit according to claim 1, wherein the counter includes a level selecting system which can select a level of a pulse signal to be counted.

4. The semiconductor integrated circuit according to claim 1, wherein the A/D converting system amplifies an inputted analog signal in the A/D converting system and comprises an amplification gain selecting system.

5. The semiconductor integrated circuit according to claim 4, wherein the amplification gain selecting system sets an amplification gain to even multiple or 1/even-number multiple.

6. The semiconductor integrated circuit according to claim 1, wherein the register loads a counter value of the counter in synchronization with a carrier signal of the PWM signal generating system, and
the A/D converting system starts A/D conversion in synchronization with a PWM signal of the PWM signal generating system.

7. A PWM signal output device using a semiconductor integrated circuit having a PWM signal generating system for generating a PWM signal according to set time data, wherein the semiconductor integrated circuit comprises: a counter which counts a pulse width of a pulse signal inputted from the outside of the semiconductor integrated circuit with delay from the PWM signal; a register which loads a counter value of the counter in synchronization with the PWM signal; and an A/D converting system for converting an analog signal serving as a source signal of a pulse signal inputted from the outside to a digital signal, and a storage system which stores therein: a PWM voltage command time value obtained by converting a voltage command value to time data; a PWM setting time value set in the PWM signal generating system; a register value of the register; an A/D conversion result value of the A/D converting system, and wherein, in a cyclic processing performed for each predetermined cycle, a next PWM setting time value is calculated and set using the register value, the A/D conversion result value, the PWM voltage command time value, and the PWM setting time value.

8. The PWM signal output device according to claim 7, wherein an error voltage between the A/D conversion result value and the reference DC voltage value is obtained and a voltage command value is obtained by compensating for the error voltage, and an error time between a pulse width time of the pulse signal obtained from the register value and the PWM setting time value is obtained and the next PWM setting time value is calculated and set from the error time and the PWM voltage command time value.

9. The PWM signal output device according to claim 7, wherein an error voltage between the A/D conversion result value and the reference DC voltage value is obtained and a voltage command value is obtained by compensating for the error voltage, and an error time between a pulse width time of the pulse signal obtained from the register value and the PWM voltage command time value is obtained so that the next PWM setting time value is calculated and set from the error time and the PWM setting time value.

10. The PWM signal output device according to claim 7, wherein the A/D converting system starts A/D conversion at a timing where a level of a PWM signal of the PWM signal generating system is changed, and an error voltage is obtained from differences of respective A/D conversion result values and the voltage command value.

11. The PWM signal output device according to claim 7, wherein the A/D converting system performs A/D conversion continuously to obtain an error voltage from an average value of the A/D conversion result values while the pulse signals are in the same level and the voltage command value.

12. The PWM signal output device according to claim 7, wherein the A/D converting system performs A/D conversion continuously to obtain a minimal area based on a product A/D conversion result values and an A/D conversion time for each A/D conversion result and calculates the PWM voltage command time value from the minimal area.

13. A power conversion control apparatus comprising a semiconductor integrated circuit having a PWM signal generating system for generating a PWM signal according to set time data and a power converting circuit having at least two switching elements for converting DC power to AC power, wherein the semiconductor integrated circuit comprises: a counter which counts a pulse width of a pulse signal inputted from the outside of the semiconductor integrated circuit with delay from the PW signal; a register which loads a counter value of the counter in synchronization with the PWM signal; and an A/D converting system for converting an analog signal serving as a source signal of the pulse signal inputted from the outside of the semiconductor integrated circuit to a digital signal, and wherein the semiconductor integrated circuit comprises a storage system for: outputting a signal of a predetermined pattern as the PWM signal; obtaining an error time between a pulse width time of the pulse signal at the outputting time and a PWM setting time value or a PWM voltage command time value; and storing the error time as a delay time value of the at least two switching elements.

14. The power conversion control apparatus according to claim 13, wherein abnormality of the switching element is determined from the delay time value stored in the storage system.

* * * * *